(12) United States Patent
Hapke et al.

(10) Patent No.: US 8,103,925 B2
(45) Date of Patent: Jan. 24, 2012

(54) ON-CHIP LOGIC TO SUPPORT COMPRESSED X-MASKING FOR BIST

(75) Inventors: Friedrich Hapke, Winsen (DE); Michael Wittke, Pinneberg (DE); Reinhard Meier, Buxtehude (DE)

(73) Assignee: Mentor Graphics Corporation, Wilsonville, OR (US)

( * ) Notice: Subject to any disclaimer, the term of this patent is extended or adjusted under 35 U.S.C. 154(b) by 25 days.

(21) Appl. No.: 12/625,487

(22) Filed: Nov. 24, 2009

(65) Prior Publication Data

US 2010/0299567 A1 Nov. 25, 2010

Related U.S. Application Data

(60) Provisional application No. 61/117,239, filed on Nov. 24, 2008.

(51) Int. Cl.
*G01R 31/28* (2006.01)
(52) U.S. Cl. ........................................ 714/726; 714/732
(58) Field of Classification Search .................. 714/726, 714/732, 742
See application file for complete search history.

(56) References Cited

U.S. PATENT DOCUMENTS

| | | | |
|---|---|---|---|
| 6,789,221 B2 | 9/2004 | Hapke | |
| 6,829,740 B2 * | 12/2004 | Rajski et al. | 714/729 |
| 7,032,148 B2 * | 4/2006 | Wang et al. | 714/729 |
| 7,376,873 B2 | 5/2008 | Vranken et al. | |
| 7,779,322 B1 * | 8/2010 | Wang et al. | 714/729 |
| 7,805,649 B2 * | 9/2010 | Rajski et al. | 714/732 |
| 2004/0237015 A1 * | 11/2004 | Abdel-Hafez et al. | 714/726 |
| 2010/0117658 A1 | 5/2010 | Hapke et al. | |

OTHER PUBLICATIONS

Santos, M.B.; Teixeira, J.P.; , "Functional-oriented mask-based built-in self-test," Computers & Digital Techniques, IET , vol. 1, No. 5, pp. 491-498, Sep. 2007 doi: 10.1049/iet-cdt:20060073 URL: http://ieeexplore.ieee.org/stamp/stamp.jsp?tp=&arnumber=4312774&isnumber=4312767.*

Yuyi Tang; Wunderlich, H.-J.; Piet Engelke; Polian, I.; Becker, B.; Schloffel, J.; Hapke, F.; Wittke, M.; , "X-masking during logic BIST and its impact on defect coverage," Very Large Scale Integration (VLSI) Systems, IEEE Transactions on , vol. 14, No. 2, pp. 193- 202, Feb. 2006 doi: 10.1109/TVLSI.2005.863742.*

Yuyi Tang; Wunderlich, H.-J.; Vranken, H.; Hapke, F.; Wittke, M.; Engelke, P.; Polian, I.; Becker, B.; , "X-masking during logic BIST and its impact on defect coverage," Test Conference, 2004. Proceedings. ITC 2004. International , vol., No., pp. 442-451, Oct. 26-28, 2004 doi: 10.1109/TEST.2004.1386980.*

* cited by examiner

*Primary Examiner* — Cynthia Britt

(57) ABSTRACT

Techniques are provided for X-masking using at least some masking information provided by on-chip logic, in lieu of masking information provided from off of the integrated circuit being tested. The masking information is provided by a masking information source on the integrated circuit being tested, such as, for example, a read-only memory (ROM) circuit, that feeds the masking information to the X-masking logic. With these implementations of the invention, it is possible to perform X-masking independent from any external data, thus enabling X-masking for a logic built-in self-test without requiring an external testing device.

8 Claims, 4 Drawing Sheets

ON-CHIP LOGIC TO SUPPORT COMPRESSED X-MASKING FOR BIST

RELATED APPLICATIONS

This application claims priority to U.S. Provisional Patent Application No. 61/117,239, entitled "On-Chip Logic To Support Compressed X-Masking For Logic-BIST," filed on Nov. 24, 2008, and naming Friedrich Hapke et al. as inventors, which application is incorporated entirely herein by reference.

FIELD OF THE INVENTION

The present invention is directed to the masking of data generated by a scanchain test of an integrated circuit device. Various implementations of the invention may be particularly useful for allowing of masking test responses produced by a built-in self-test (BIST) operation using masking data provided from on the integrated circuit being tested, rather than masking data imported from off of the integrated circuit.

BACKGROUND OF THE INVENTION

As integrated circuits continue to develop, they continue to have higher device densities and clocking rates. As a result, it requires ever-increasing numbers of test vectors to properly test them, which in turn requires larger and larger amounts of tester vector memory. Still further, manufacturing newer integrated circuits requires even more complex manufacturing techniques, with the corresponding increase in problems and costs related to the production of integrated circuits. To address these problems, and to allow for a self-test of integrated circuits in the field, a testing technique referred to as "built-in self-test" (BIST) is expected to be used more and more in the future.

With logic built-in self-test (LBIST), test circuits for testing the functional logic of an integrated circuit are added to the circuit's design. FIG. 1 illustrates the general configuration of an integrated circuit using LBIST. As seen in this figure, an integrated circuit 101 includes a test stimulus generator 103, a circuit-under-test (CUT) 105, and a test response evaluator 107. The integrated circuit 101 also includes a test control module 109, for controlling the operation of the test stimulus generator 103, the circuit-under-test (CUT) 105, and the test response evaluator 107. With this arrangement, the test stimulus generator 103 generates test stimuli that are applied to the circuit-under-test 105 through scan chains. The scan chains may be, for example, flip-flops in the circuit-under-test 105 that can be configured into serial shift registers during a test mode.

The self-test is performed by repeatedly shifting the generated test stimuli into the scan chains so that they are applied to the circuit-under-test 105, and operating the circuit-under-test 105 for a number of clock cycles in its functional application mode. Various techniques for generating efficient stimuli are well-known in the art. These include, for example, techniques for generating test stimuli for built-in self-test applications that improve the random testability of the circuit by state-of-the-art test points insertion (TPI), by a linear feedback shift register (LFSR) reseeding, by Bit-Flipping-Logic (see, for example, U.S. Pat. No. 6,789,221, issued Sep. 7, 2004, which patent is incorporated entirely herein by reference), or by a cycle-based stimuli generation (see, for example, European Patent Application No. 06126627.6, filed on Dec. 20, 2006, which application is incorporated entirely herein by reference as well).

The responses produced by the circuit-under-test 105 are captured by the scan chains, and relayed to the test response evaluator 107 where, for example, they are compacted on-chip using a compacting device, such as a multiple input shift register (MISR), to produce a compacted test signature. The compacted test signature can then be compared against a corresponding fault-free signature to determine if the integrated circuit has any of the faults tested for by the test stimuli. Depending upon the implementation, the compacted test signature can be compared with the fault-free signature on-chip, or after it has been exported off of the integrated circuit for comparison by, for example, automated test equipment.

While the responses produced by the circuit-under-test 105 include data bits that have known good circuit response data and which can detect a fault, the responses also may contain "unknown" data values (that is, data values that cannot be predicted because they may vary from test to test). If these unknown data values (referred to herein as "X values" or "Xs") are compacted with the relevant data values, then the compacted test signature may not contain enough stable and predictable information to determine if the integrated circuit has one or more of the targeted faults.

The most common technique to get avoid the occurrence of X values in logic-BIST is referred to as "X bounding." With this technique, the circuit-under-test is modified to prevent noted X values from occurring. This technique has a significant disadvantage, however, in that the functional core logic has to be changed, which might impact the timing of the core. An alternative technique to avoid the effect of X values is to add some logic to mask out the X values after they have been output from the core logic, a technique sometimes referred to as "X-masking." This masking technique is typically used in conventional test response compression techniques, such as, for example, the compression techniques provided by the Mentor Graphics TestKompress electronic design automation (EDA) tools available from Mentor Graphics Corporation of Wilsonville, Oreg. (It should be appreciated that, as used herein, the term "conventional" may include built-in self-test compression techniques that are employed in the integrated circuit manufacturing industry, but may nonetheless be proprietary and maintained in secret, and thus not be publicly known.)

With these conventional compression techniques, however, the test response values from the core logic are masked based upon masking information that is imported from off of the integrated circuit being tested. More particularly, with conventional compression techniques, the masking circuitry is controlled based upon masking data that must be provided from outside of the integrated circuit being tested. Typically, this masking data must be provided by a separate, external testing device, requiring the use of such a device to complete a built-in self-test operation.

BRIEF SUMMARY OF THE INVENTION

Various implementations of the invention provide techniques for X-masking using at least some masking information provided by on-chip logic, in lieu of masking information provided from off of the integrated circuit being tested. With various examples of the invention, the masking information is no longer applied by a separate data source (i.e., from a data signal originating off of the integrated circuit being tested). Instead, the masking information is provided by a masking information source on the integrated circuit being tested, such as, for example, a read-only memory (ROM) circuit, that feeds the masking information to the X-masking logic. With these implementations of the invention, it is possible to perform X-masking independent from any external data, thus enabling X-masking for a logic built-in self-test without requiring an external testing device.

DETAILED DESCRIPTION OF THE INVENTION

Built-in Self-Test System Employing Compression

Figure 1:
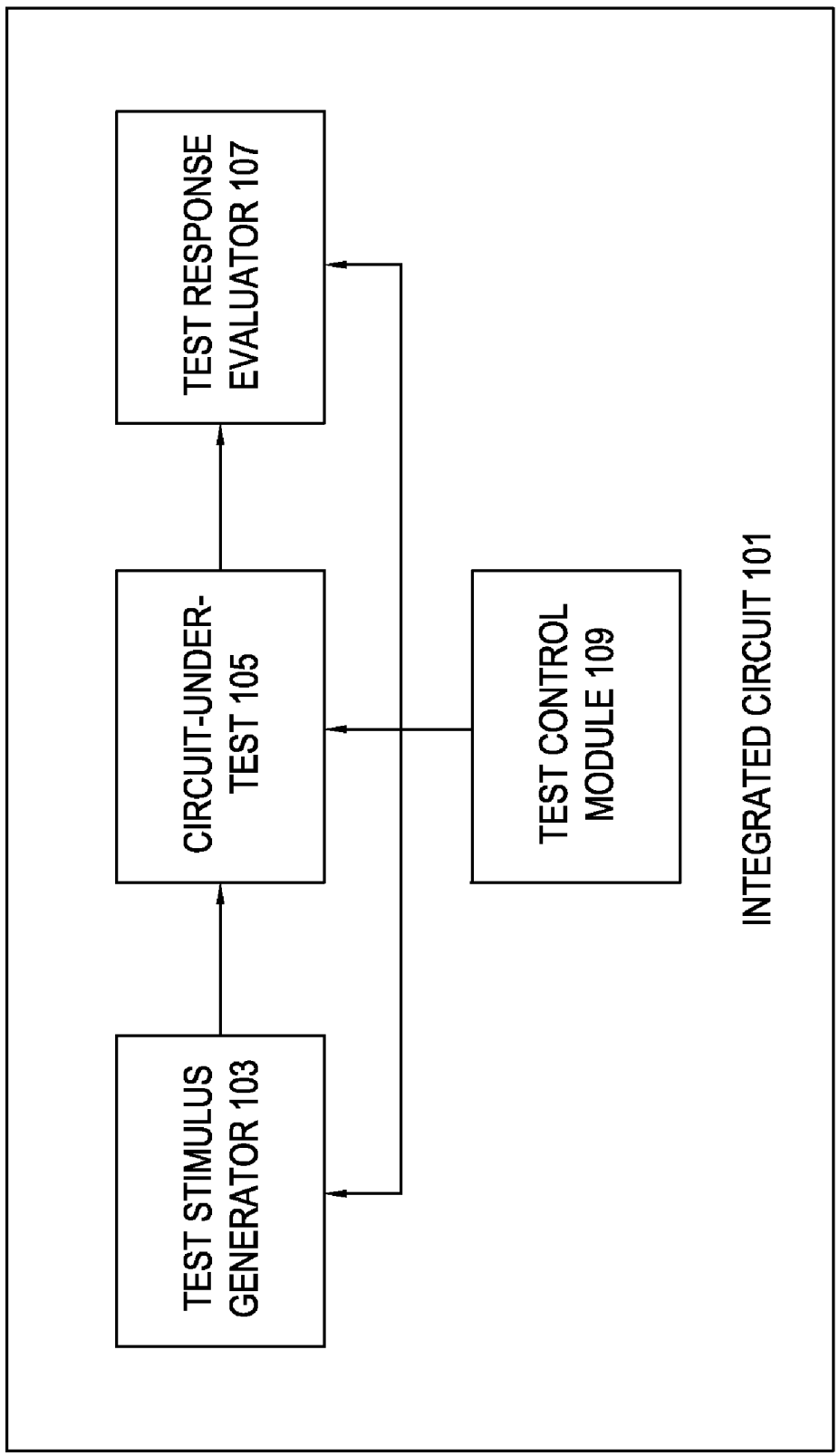
FIG. 1 illustrates the general configuration of an integrated circuit using LBIST.
Figure 2:
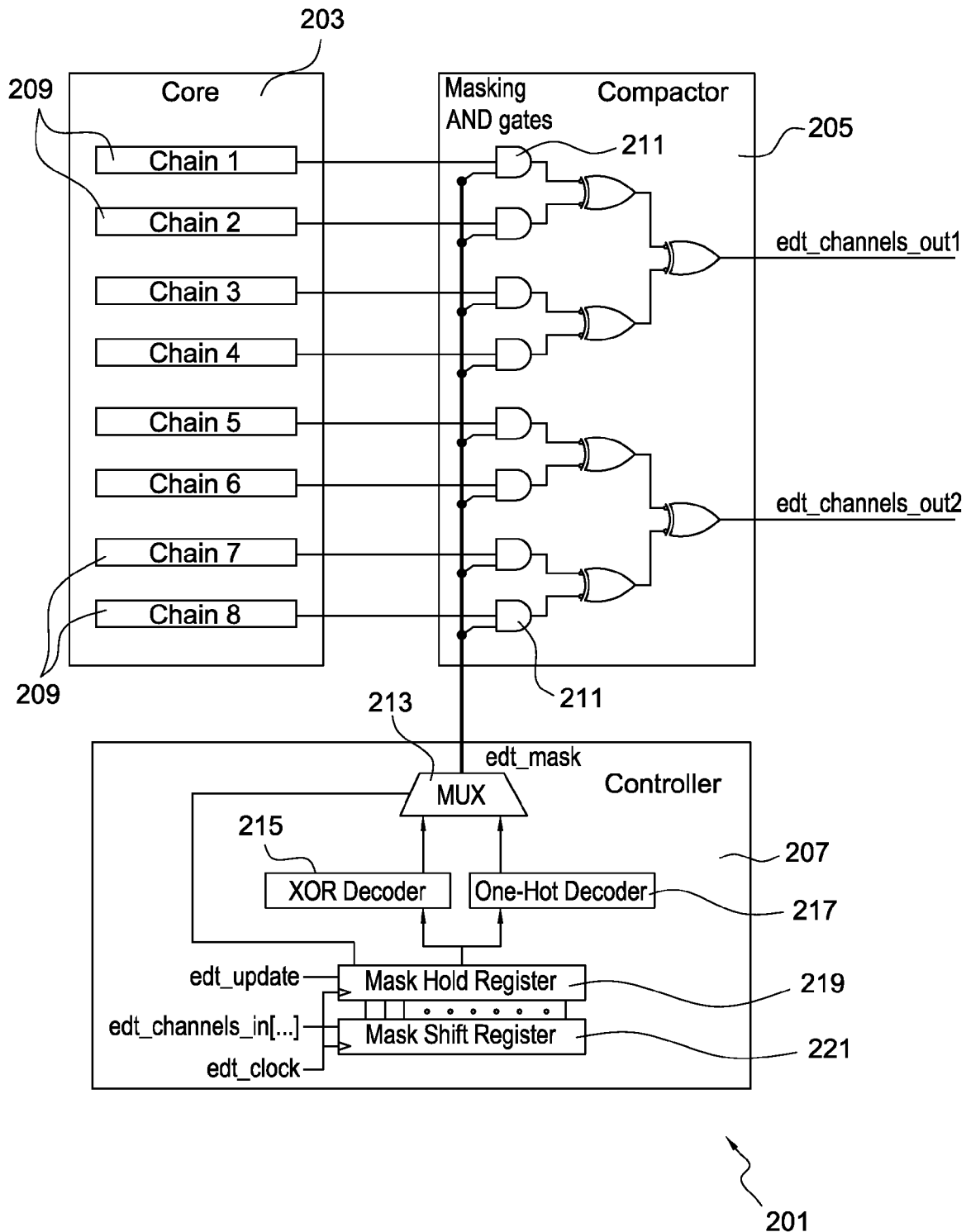
FIG. 2 illustrates a built-in self-test system using conventional compression techniques.

FIG. 2 illustrates an example of a built-in self-test system 201 using compression techniques according to the Mentor Graphics Xpress Masking Logic compression techniques available from Mentor Graphics Corporation of Wilsonville, Oreg. As seen in this figure, the system 201 includes core logic 203, a compactor 205, and a controller 207. The core logic 203 includes a plurality of scan chains 209, which carry test response results from the circuitry-under-test (not shown) in the core logic 203 out to the compactor 205. The compactor 205 then includes mask gates 211 for masking data values provided by the scan chains 209. The outputs of the mask gates 211 (which, in the illustrated example, are 8 bits) are then compacted by compacting circuitry, and the compacted data is output in two bits (i.e., edt_channels_out1 and edt_channels_out2).

In the illustrated example, the mask gates 211 are AND gates, but it will be appreciated that masking circuitry with other logic configurations can be employed to mask the data values of one or more of the scan chains 209. It also should be appreciated that, with alternate implementations, the masking circuitry can be arranged so the data values from multiple scan chains 209 can be masked simultaneously (e.g., where the outputs from multiple scan chains 209 are provided to a single mask gate 211).

The mask gates 211 are controlled by input from the controller 207. More specifically, the controller 207 includes a MUX circuit 213, a XOR decoder circuit 215, a one-hot decoder circuit 217, a mask hold register 219 and a mask shift register 221. The operation of the mask gates 211 is controlled by control data values provided from the MUX circuit 213, which in turn receives the control data values through the XOR decoder circuit 215 or the one-hot decoder circuit 217 from the mask hold register 219. The mask hold register 219, controlled by the edt_update signal, receives mask information from the mask shift register 221. The mask shift register 221 in turn receives the mask information from an external data source through the EDT channel inputs edt_channels in [ . . . ] as shown in FIG. 2. Thus, the operation of masking circuitry in this conventional compression built-in self-test system 201 (i.e., the mask gates 211) is controlled by mask information provided from an external source outside of the integrated circuit device being tested.

Built-in Self-Test System Using On-Chip Masking Information

Figure 3:
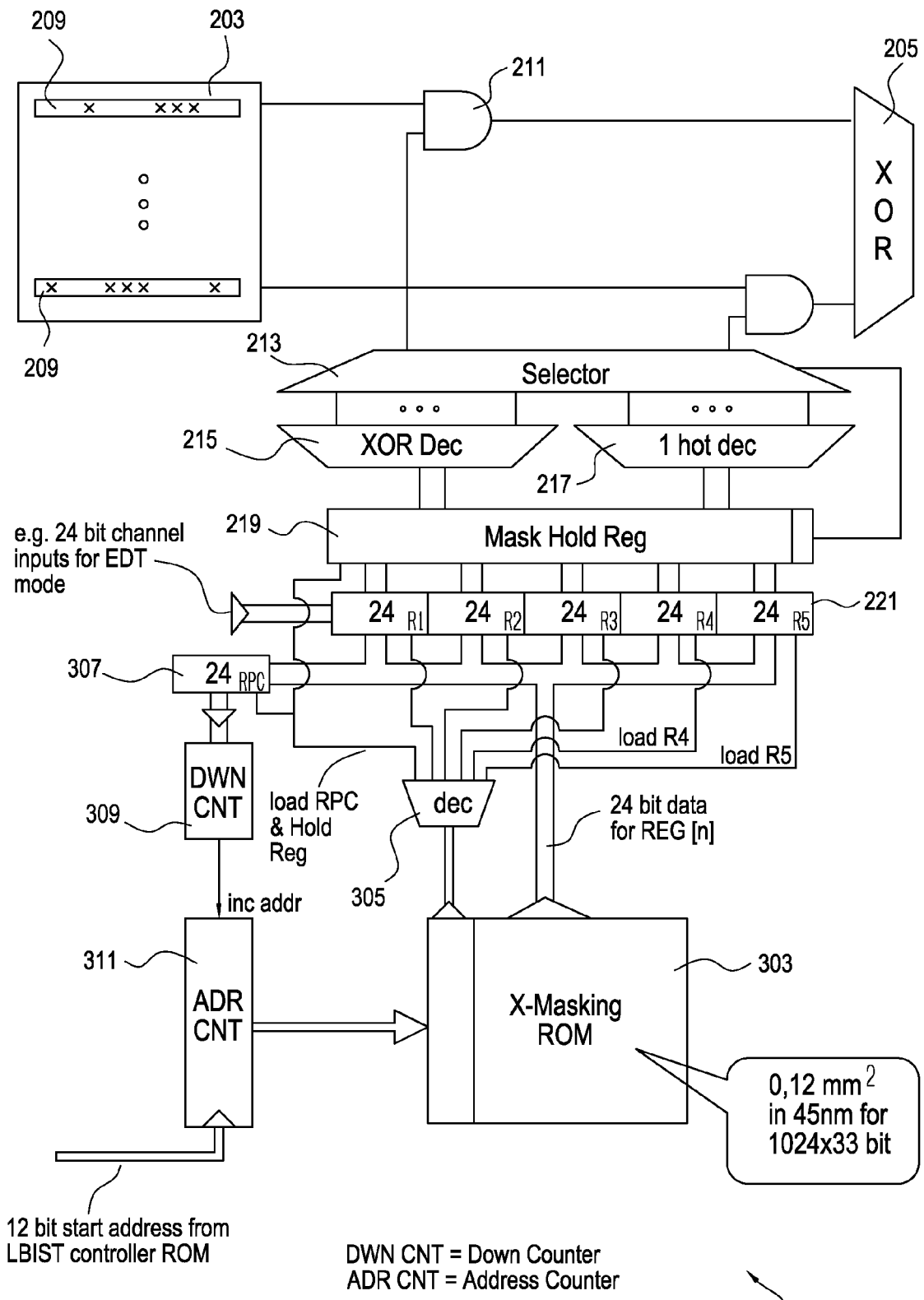
FIG. 3 illustrates an example of a built-in self-test system using conventional compression techniques according to various embodiments of the invention.

FIG. 3 illustrates an example of a built-in self-test system 301 that obtains masking information from a source on the integrated circuit being tested according to various embodiments of the invention. More particularly, this figure illustrates a built-in self-test system 301 with embedded deterministic test (EDT) compression logic and some added logic to enable X-masking for the logic self-test according to various embodiments of the invention. As seen in this figure, this additional logic comprises an X-masking read-only memory (ROM) circuit 303, a decoder circuit 305 (labeled "dec" in the figure), a repeat counter register circuit 307 (labeled "RPC" in the figure), a down counter circuit 309 (labeled "DWN CNT" in the figure) and an address counter circuit 311 (labeled "ADR CNT" in the figure). As will be discussed in more detail below, the repeat counter register circuit 307, the down counter circuit 309 and the address counter circuit 311 form a control system for determining the address in the x-masking memory circuit 303 that will be accessed.

Figure 4:
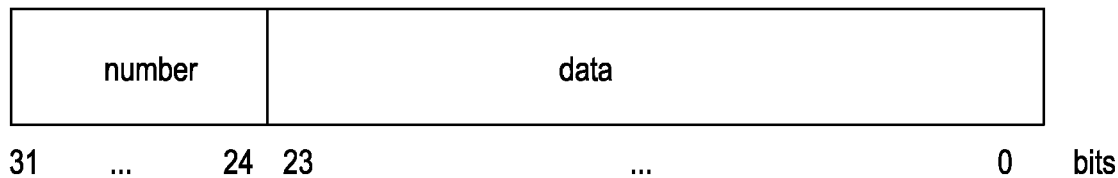
FIG. 4 illustrates an example of a X-masking ROM data word that may be employed according to various embodiments of the invention.
Figure 5:
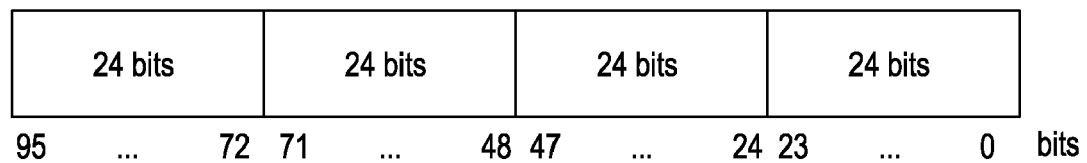
FIG. 5 illustrates an example of portions of a mask hold register that may be employed according to various embodiments of the invention.

With various implementations of the invention, a data word of the X-masking ROM circuit 303 includes two portions: a register number and a data portion. For a 32-bit word, this could provide, for example, 8 bits for the register number, and 24 bits for the data portion, as illustrated in FIG. 4. With various implementations of the invention, the mask shift register 221 likewise is divided into portions, each portion having the same size as the number of data bits in the data word of the X-masking ROM circuit 303. Thus, with the example illustrated in FIG. 3, the mask shift register 221 would be divided into 24 bit portions as shown in FIGS. 3 and 5. Of course, it should be appreciated that various implementations of the invention may employ a plurality of mask shift registers 221 instead of the single mask shift register 221 show in FIG. 3. It also should be appreciated that the size of the "number" portion of the data word employed by the X-masking ROM circuit 303 corresponds to the number of data portions of the mask shift register (or registers 221) in the design.

As will be discussed in more detail below, the data output from the X-masking ROM circuit 303 is provided to the decoder circuit 305, and the resulting output from the decoder circuit 305 is then used to control the operation of the a built-in self-test system 301. For example, with various implementations of the invention, the outputs of the decoder circuit 305 may instruct the components of built-in self-test system 301 to perform one or more of the following operations:

Load one data portion of the mask shift register 221 with the data portion of the data word from the X-masking ROM circuit 303;

Load all data portions of the mask shift register 221 in parallel with the data portion of the data word from the X-masking ROM circuit 303;

Load the repeat counter register circuit 307 (which is acting as a repeat counter in the illustrated example) and load the mask hold register 219 with the data from the mask shift register 221.

With the example discussed above, the 8-bit register number in the data word used by the X-masking ROM circuit 303 allows for the address of $2^8-2=254$ data portions of the mask shift register 221.

As will be appreciated from FIG. 3, in order to apply a certain mask pattern, the data portions of the mask shift register 221 have to be loaded. This can be done according to various examples of the invention by storing and retrieving the same number of data words from the X-masking ROM circuit 303. Thus, the first data word in the X-masking ROM circuit 303 addresses the first data portion of the mask shift register 221 and applies the data to this portion. Then the second data word in the X-masking ROM circuit 303 addresses the second data portion of the mask shift register 221 and applies the data to this portion. This continues until all of the data portions of the mask shift register 221 are loaded with the appropriate data. Alternatively, the same data word could be loaded into all data portions of the mask shift register 221 in parallel, resulting in a very regular mask pattern. With these implementations of the invention, only one data word in the X-masking ROM circuit 303 is required for the complete mask pattern.

After all the data portions of the mask shift register 221 have been loaded, the next data word in the X-masking ROM circuit 303 is used to load the mask hold register 219 with the data from the mask shift register 221, and to load the repeat counter register circuit 307. The repeat counter register circuit 307 may be, e.g., a register with the same or smaller size than the data portion of the data word stored by the X-masking ROM circuit 303. The data provided by the X-masking ROM circuit 303 is the number of cycles for which the mask in the mask hold register 219 should be used to mask out X states from the core 203. Therefore the repeat counter register circuit 307 counts down every cycle. When the value stored by the repeat counter register circuit 307 is 0, then the value stored by the address counter circuit 311 is increased by 1, so that the next data word stored in the X-masking ROM circuit 303 is selected for use. Another portion of the mask shift register 221 mask shift register 221 then can be loaded, as described above.

Table 1 below illustrates describes a possible content of the X-masking ROM circuit 303 and the related hardware activities that may be performed based upon this content according to various implementations of the invention.

TABLE 1

Example of operations performed

X Masking ROM

| address | number [8 bits] | data [24 bits] | hardware activities |
|---|---|---|---|
| 1 | 0000 0001 | 0xff ff fe | load Mask Shift Reg portion 1 |
| 2 | 0000 0002 | 0xff ff fd | load Mask Shift Reg portion 2 |
| 3 | 0000 0003 | 0xff 0f ff | load Mask Shift Reg portion 3 |
| 4 | 0000 0004 | 0xff ff ff | load Mask Shift Reg portion 4 |
| 5 | 1111 1111 | 0x00 00 64 | update Mask Hold Register and use this mask for 100 cycles |
| 6 | 0000 0000 | 0xaa af f0 | load Mask Shift Reg portion 1-4 |
| 7 | 1111 1111 | 0x00 00 0f | update Mask Hold Register and use this mask for 15 cycles |
| 8 | 0000 0000 | 0xaa af f0 | load Mask Shift Reg portion 1-4 |
| 9 | 1111 1111 | 0x00 00 25 | update Mask Hold Register and use this mask for 37 cycles |
| A | 0000 0001 | 0x11 00 ff | load Mask Shift Reg portion 1 |
| B | 0000 0002 | 0xff ff ff | load Mask Shift Reg portion 2 |
| C | 0000 0003 | 0xff 0f 55 | load Mask Shift Reg portion 3 |
| D | 0000 0004 | 0x00 aa 55 | load Mask Shift Reg portion 4 |
| E | 1111 1111 | 0x00 00 0c | update Mask Hold Register and use this mask for 12 cycles |
| F | 0000 0001 | 0xff ff ff | load Mask Shift Reg portion 1 |
| 10 | 0000 0002 | 0x01 00 ff | load Mask Shift Reg portion 2 |
| 11 | 0000 0003 | 0x0a 0a 0f | load Mask Shift Reg portion 3 |
| 12 | 0000 0004 | 0x00 00 00 | load Mask Shift Reg portion 4 |
| 13 | 1111 1111 | 0x00 00 64 | update Mask Hold Register and use this mask for 100 cycles | based on content of an X-Masking ROM circuit

At the beginning of the masking process, the address counter circuit 311 is loaded with the start address of the X-masking ROM circuit 303 (e.g., the XML start address) from an overall control read-only memory (ROM) circuit (not shown) or equivalent controller. The effect of this will be that the X-masking ROM circuit 303 will output a register number that will be decoded by the decoder circuit 305 (in the illustrated example, an 8 bit register number). In addition, the X-masking ROM circuit 303 will output a data word (i.e., 24 bits in the illustrated example) that will be loaded into the selected portion of the mask shift register 221. Next, the address counter circuit 311 is incremented and, as such, another portion of the mask shift register 221 will be loaded from the X-masking ROM circuit 303. This is repeated until the repeat counter register circuit 307 is loaded.

Loading the repeat counter register circuit 307 instructs the built-in self-test system 301 to load the data stored in the repeat counter register circuit 307 into the down counter circuit 309, and to load the data from the mask shift register 221 into the mask hold register 219. It also stops the address incrementation of the address counter circuit 311 for the X-masking ROM circuit 303 until the down counter circuit 309 has reached its zero state. During this time, no further data is loaded into the mask shift register 221 and the built-in self-test system 301 operates in shift mode for the specified number of cycles. As a result, the built-in self-test system 301 enables the use of the desired mask pattern to remove the X-values from the test results, without requiring that the mask information be provided from outside of the integrated circuit.

As will be appreciated by those of ordinary skill in the art, a conventional automatic test pattern generation (ATPG) tool can be used to calculate the particular mask pattern needed to mask out all of the X states from the core, and thus to calculate the content of the X-masking ROM circuit 303. With some implementations of the invention, the hardware generation process may beneficially be separated from the calculation of the mask pattern and/or the contents of the X-masking ROM circuit 303. More particularly the additional hardware circuitry employed by various examples of the invention could be generated without the designer having and adjusting for all of the design details of the core.

Further, various implementations of the invention can make use of the Xpress masking logic available from Mentor Graphics Corporation of Wilsonville, Oreg. With these embodiments, it is possible to perform a scan test with compressed stimuli and responses via an external test system and also a logic self-test with this new proposed hardware.

With various embodiments of the invention, the logic built-in self-test can be executed not only in production test during wafer and final test, but also when the chip is placed into the application system in the field. Further, logic provided according to various embodiments of the invention may re-use the X-masking hardware of the EDT so that the chip manufacturer can decide when to operate the integrated circuit in test compression mode and when to operate it in the logic BIST mode. Further, with various embodiments of the invention, no X-bounding step is required in the design flow. This can allow the design flow to be very simple so that, e.g., the RTL code for the logic BIST system can be created very early in the design phase and need not be dependent on the logic configuration of the circuit-under-test. The designer can then implement the design as desired, with an LBIST X-masking solution according to various embodiments of the invention ensuring that any unknowns (Xs) can be masked out without requiring changes to the circuit-under-test itself.

Thus, the circuit-under-test design can be changed up to the final design stages, and the LBIST ATPG tool will only have to create a new data load to be stored in the X-masking ROM circuit 303 at the end stages of the design. Due to the modular register approach, an LBIST X-masking solution according to various embodiments of the invention can be used even for a design with many scan chains. The LBIST solution can then re-use the hardware that is needed for test compression, i.e., it can be an add-on to the test compression hardware. Further, an LBIST solution according to various embodiments of the invention can fully support multiple clock designs.

It should be appreciated that, while particular implementations of the invention of the invention have been described above, a variety of further implementations will be apparent to those of ordinary skill in the art from the subject matter described herein. For example, as previously noted, some implementations of the invention may use a plurality of shift registers 221 in place of the single shift register 221 shown in FIG. 3. Similarly, various implementations of the invention may employ multiple mask hold registers 219, multiple registers 307, multiple X-masking memory circuits 303, or some combination thereof. Further, while a particular logic configuration has been described for periodically incrementing the memory address to be accessed the X-masking memory circuit 303, still other implementations may of course employ a different logic configuration to increment, or alternately, decrement, the memory address to be accessed the X-masking memory circuit 303. Still further, while the X-masking memory circuit 303 has been described as a read-only memory (ROM), still other implementations of the invention may employ any memory circuit to store and provide the masking information as discussed in detail above, including a rewritable memory circuit.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific implementations of the invention have been discussed with regard to logic built-in self-test techniques, it should be appreciated that implementations of the invention also may be employed with other types of built-in self-test techniques, such as memory built-in self-test (MBIST) techniques.

What is claimed is:

1. A built-in self-test system in an integrated circuit device, comprising:
    a plurality of scan chains configured to capture test responses generated by testing an integrated circuit device;
    read-only memory circuitry configured to store a plurality of masking data sets and control information, the plurality of masking data sets comprising masking information;
    a first memory circuit configured to receive one of the plurality of masking data sets from the read-only memory circuitry based on the control information;
    a second memory circuit configured to receive the one of the plurality of masking data sets from the first memory circuit and to keep the one of the plurality of masking data sets for one or more clock cycles based on the control information; and
    masking circuitry configured outputs from one or more of the plurality of scan chains for the one or more clock cycles based on the one of the plurality of masking data sets stored in the second memory circuit.

2. The built-in self-test system recited in claim 1, further comprising:
    a control circuit configured to receive the control information from the read-only memory circuitry and execute instructions included in the control information.

3. The built-in self-test system recited in claim 2, wherein the control circuit includes:
    a decoder configured to extract the instructions included in the control information and using the instructions to control components of the built-in self-test system;
    a repeat counter register circuit configured to be controllable by the decoder and to receive repeat data from the read-only memory circuitry; and
    a down counter circuit connected coupled to the repeat counter register circuit.

4. The built-in self-test system recited in claim 2, wherein:
    the control circuit includes an address counter circuit configured to provide an address of the read-only memory circuitry to be accessed.

5. The built-in self-test system recited in claim 1, wherein:
    each of the plurality of masking data sets employs one or more memory words.

6. The built-in self-test system recited in claim 5, wherein:
    each of the one or more memory words comprises a masking data portion and a control portion.

7. The built-in self-test system recited in claim 6, wherein:
    the control portion comprising location information for the masking data portion, the location information indicating where the masking data portion will be delivered.

8. The built-in self-test system recited in claim 1, wherein:
    the first memory circuit is a shift register with parallel outputs coupled to the second memory circuit and parallel inputs coupled to the read-only memory circuitry.

* * * * *